United States Patent [19]
Fulkerson

[11] Patent Number: 5,355,031
[45] Date of Patent: Oct. 11, 1994

[54] COMPLEMENTARY LOGIC WITH N-CHANNEL OUTPUT TRANSISTORS

[75] Inventor: David E. Fulkerson, Minnetonka, Minn.

[73] Assignee: Honeywell Inc., Minneapolis, Minn.

[21] Appl. No.: 999,540

[22] Filed: Dec. 31, 1992

Related U.S. Application Data

[63] Continuation-in-part of Ser. No. 816,439, Dec. 31, 1991, abandoned.

[51] Int. Cl.$^5$ .......................................... H03K 19/094
[52] U.S. Cl. ..................................... 307/451; 307/443; 307/450
[58] Field of Search ................ 307/443, 448, 450, 451

[56] References Cited

U.S. PATENT DOCUMENTS

| | | | |
|---|---|---|---|
| 4,514,649 | 4/1985 | Nuzillat et al. | 307/450 |
| 4,707,622 | 11/1987 | Takao et al. | 307/448 |
| 4,712,022 | 12/1987 | Vu | 307/443 |
| 4,810,969 | 3/1989 | Fulkerson | 307/450 |
| 4,835,419 | 5/1989 | Chappell et al. | 307/451 |
| 4,912,677 | 3/1990 | Itano et al. | 365/189.08 |
| 4,918,336 | 4/1990 | Graham et al. | 307/448 |
| 4,954,730 | 9/1990 | Yoh | 307/451 |

FOREIGN PATENT DOCUMENTS

0267361A1 5/1988 European Pat. Off. .

OTHER PUBLICATIONS

"Merged BiCMOS Logic to Extend the CMOS/BiCMOS Performance Crossover Below 2.5-V Supply", IEEE Journal of Solid-State Circuits, vol. 26, No. 11, Nov. 1991, pp. 1606–1613, by R. Ritts et al.

"Digital GaAs IC Technology" Wafer Processing and Circuit Design, of the GaAs IC Symposium in Grenelefe, Fla., on Oct. 27, 1986.

"High Speed CMOS NOR Circuit"; Author Unknown; Research Disclosure; Sep. 1984; No. 245; ®Kenneth Mason Puld. Ltd., England.

"Principles of CMOS VLSI Design, A Systems Perspective"; Weste et al.; pp. 14–15, ®1985 by AT&T Bell Labs., Inc. and Kamran Eshraghian.

"CMOS Devices & Technology for VLSI"; Chen, John Y.; pp. 104–109; ®1990 by Prentice-Hall, Inc.

Primary Examiner—Edward P. Westin
Assistant Examiner—Benjamin D. Driscoll
Attorney, Agent, or Firm—John G. Shudy, Jr.

[57] ABSTRACT

A gate having a complementary input stage (12) and an N-channel push-pull output stage (14). This circuit is faster than a circuit with a single complementary stage because the N-channel transistors can pull-up or pull down the load capacitance more quickly than P-channel transistors can. A fundamental aspect of the invention is the replacement of the input P-channel input transistors (182) of standard logic circuits, particularly CMOS, with a two N-channel and one P-channel transistor input circuit (184). The circuit may use field effect transistors exclusively as elements.

5 Claims, 14 Drawing Sheets

| A | B | C | D | $\overline{(A+B) \cdot (C+D)}$ |
|---|---|---|---|---|
| 0 | 0 | 0 | 0 | 1 |
| 0 | 0 | 0 | 1 | 1 |
| 0 | 0 | 1 | 0 | 1 |
| 0 | 0 | 1 | 1 | 1 |
| 0 | 1 | 0 | 0 | 1 |
| 0 | 1 | 0 | 1 | 0 |
| 0 | 1 | 1 | 0 | 0 |
| 0 | 1 | 1 | 1 | 0 |
| 1 | 0 | 0 | 0 | 1 |
| 1 | 0 | 0 | 1 | 0 |
| 1 | 0 | 1 | 0 | 0 |
| 1 | 0 | 1 | 1 | 0 |
| 1 | 1 | 0 | 0 | 1 |
| 1 | 1 | 0 | 1 | 0 |
| 1 | 1 | 1 | 0 | 0 |
| 1 | 1 | 1 | 1 | 0 |

| A | B | $\overline{(A+B)} + (A \cdot B)$ |
|---|---|---|
| 0 | 0 | 1 |
| 0 | 1 | 0 |
| 1 | 0 | 0 |
| 1 | 1 | 1 |

COMPLEMENTARY LOGIC WITH N-CHANNEL OUTPUT TRANSISTORS

This application is a continuation-in-part of application Ser. No. 07/816,439, filed Dec. 31, 1991 now abandoned.

BACKGROUND OF THE INVENTION

Many digital applications are continually requiring higher speeds at lower powers. The present invention, buffered complementary logic (BCL), provides improvements in the area of lower power and higher speed in comparison to related art technology. The basic invention includes NAND gates, complex gates such as an OR-AND-NOT, and new storage cells that can be made from the logic gates.

SUMMARY OF THE INVENTION

The present invention is a gate that utilizes a complementary circuit as an input stage and an N-channel push-pull circuit as an output stage. This circuit is faster than a circuit with a single complementary stage because the N-channel transistors can charge the load capacitance more quickly than P-channel transistors can. The circuit may use field effect transistors exclusively as elements.

BRIEF DESCRIPTION OF THE DRAWING

FIG. 2a is a schematic of the basic NAND gate.
FIG. 2b is a truth table of the inputs and output of the circuit in FIG. 2a.

DESCRIPTION OF THE PREFERRED EMBODIMENTS

Figure 1:
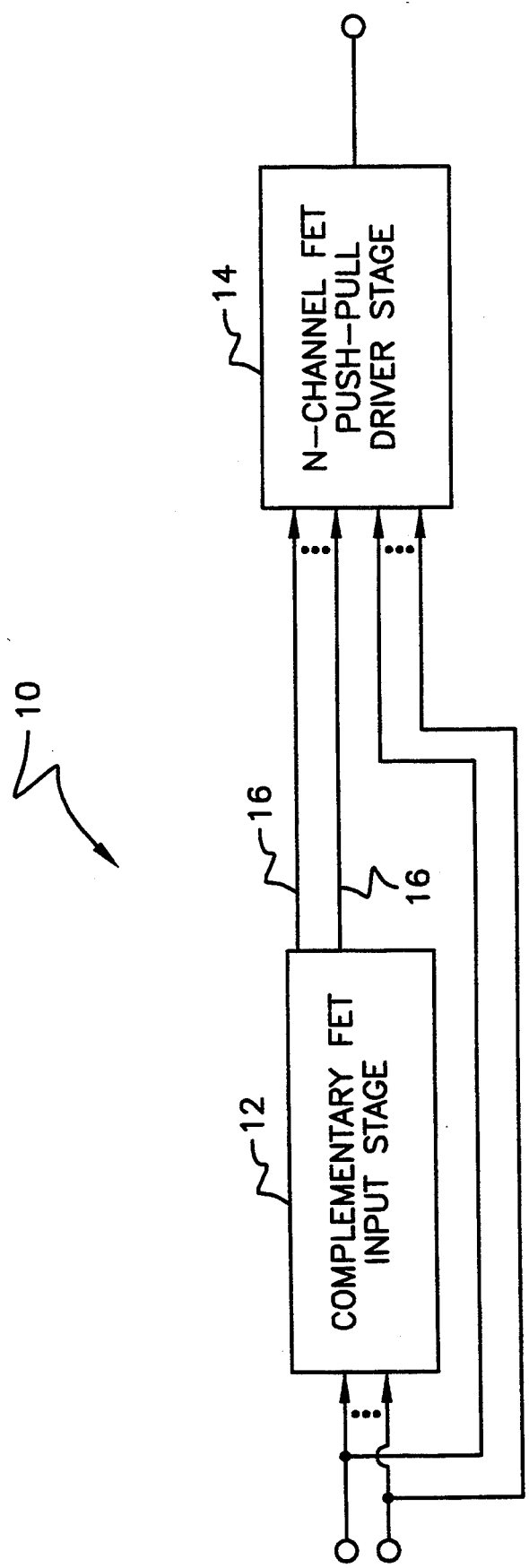
FIG. 1 is a block diagram of a basic gate.

FIG. 1 is a block diagram of buffered complementary logic gate 10 having a complementary FET input stage 12 and N-channel FET push-pull driver stage 14. The inputs may vary from one to an indefinite number, depending of the complexity of the desired logic. The intermediate signals on lines 16 drive the "push" or "pull-up" portion of the driver stage.

Figures 2A, 2B:
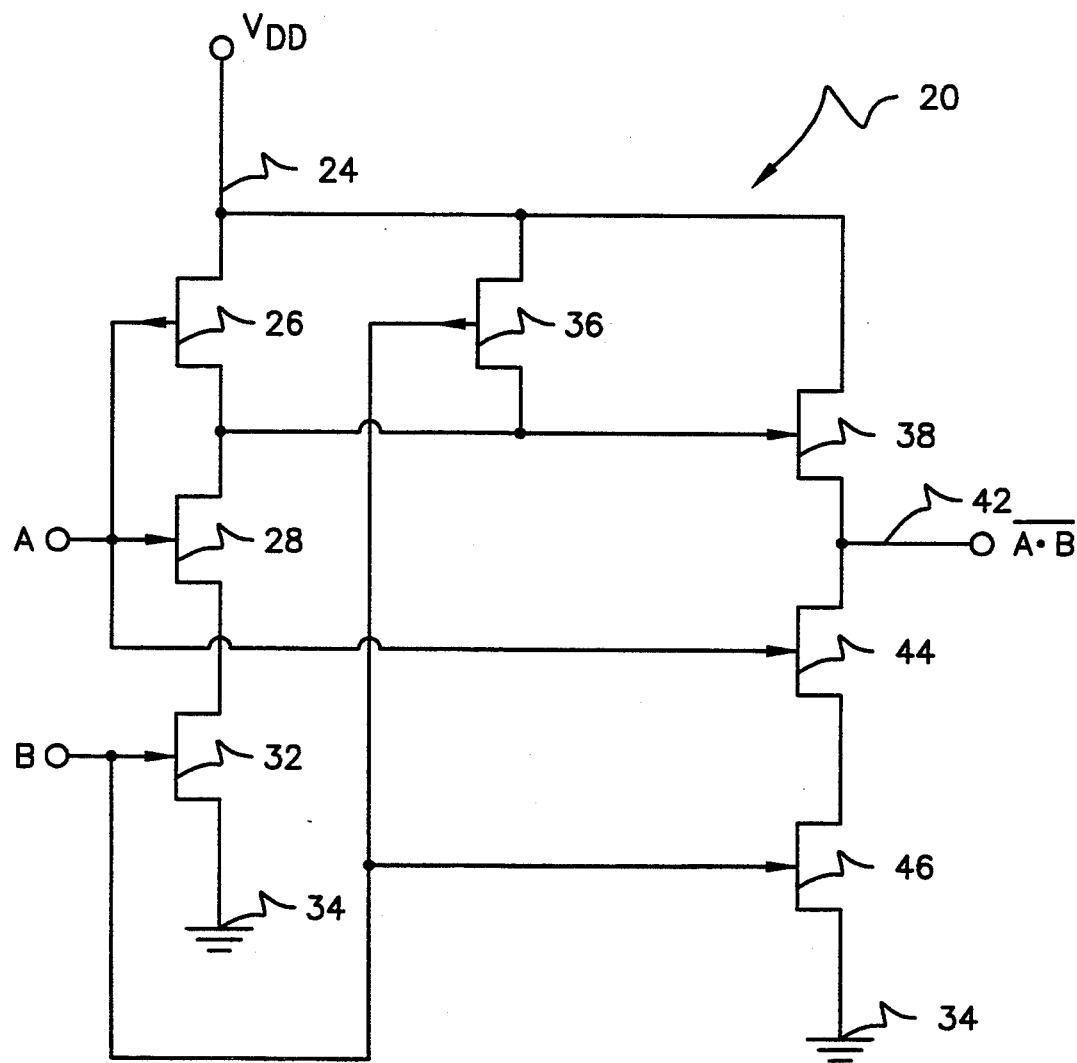

FIG. 2a is a schematic of circuit 20 which implements as a NAND logic function $\overline{A.B}$ as indicated by truth table 22 of FIG. 2b. In circuit 20 of FIG. 2a, line 24 is connected to a voltage source $V_{DD}$ of about a positive 1.5 volts DC. Transistor 26 is a P-channel field effect transistor having a source connected to line 24 and having a drain connected to the drain of transistor 28. The gate of transistor 26 could have a length of one micron and a width of 20 microns. The gate of transistor 26 is connected to the A input of the circuit. The A input of the circuit is also connected to the gate of the N-channel field effect transistor 28. The gate of transistor 28 could have a length of 1 micron and a width of 6 microns. The source of transistor 28 is connected to the drain of N-channel field effect transistor 32. The gate of transistor 32 is connected to input B and could have a length of 1 micron and a width of 6 microns. A source of transistor 32 is connected to a reference terminal or ground 34. P-channel field effect transistor 36 has a source connected to line 24 and a drain connected to the drain of transistor 28. The gate of transistor 36 is connected to input B and has a width of 20 microns and a length of 1 micron. N-channel field effect transistor 38 has a drain connected to line 24 and a source connected to output line 42. The gate of transistor 38 is connected to the drain of transistor 36. N-channel field effect transistor 44 has a drain connected to output 42 and has a gate connected to input A. The gate of transistor 44 has width of 20 microns and a length of 1 micron. The source of transistor 44 is connected to the drain of N-channel field effect transistor 46. The gate of transistor 46 is connected to input B. The gate of transistor 46 has a width of 20 microns and a length of 1 micron. The source of transistor 46 is connected to the ground or reference terminal 34.

The description of the function of NAND circuit 20, as shown in truth table 22, may begin with an instance of a logic one on input terminal A and a logic zero on input terminal B. Logic signal one is a positive voltage of about a volt to 1.5 volts and zero logic signal is approximately of a zero voltage sufficient to shut-off transistor 32. Logic signal one on the gate of transistor 26 turns off that transistor. A logic zero signal at the B input turns on transistor 36 thereby pulling up the voltage on the gate of transistor 38 thereby turning on transistor 38. So a logic zero at input B pulls the voltage of the gate of transistor 46 down thereby shutting off transistor 46; thus the output 42 due to the on condition of transistor 38 is at a high, despite the on condition of transistor 44, thereby resulting in a logic one signal on output 42.

Another example of inputs would be a logic one signal on both inputs A and B. The logic one signal on the gate of transistor 28 turns on transistor 28 and the logic one signal on the gate of transistor 32 turns on transistor 32, thereby pulling the gate of transistor 38 down close to zero as the high logic one signals on the gates of transistors 26 and 36 turn off those transistors. The logic one signals on the gates of transistors 44 and 46 and a low on the gate of transistor 38 result in the output at line 42 of zero. The above results conform with the truth table 22 for $\overline{A.B}$ in FIG. 2b.

Figure 2C:
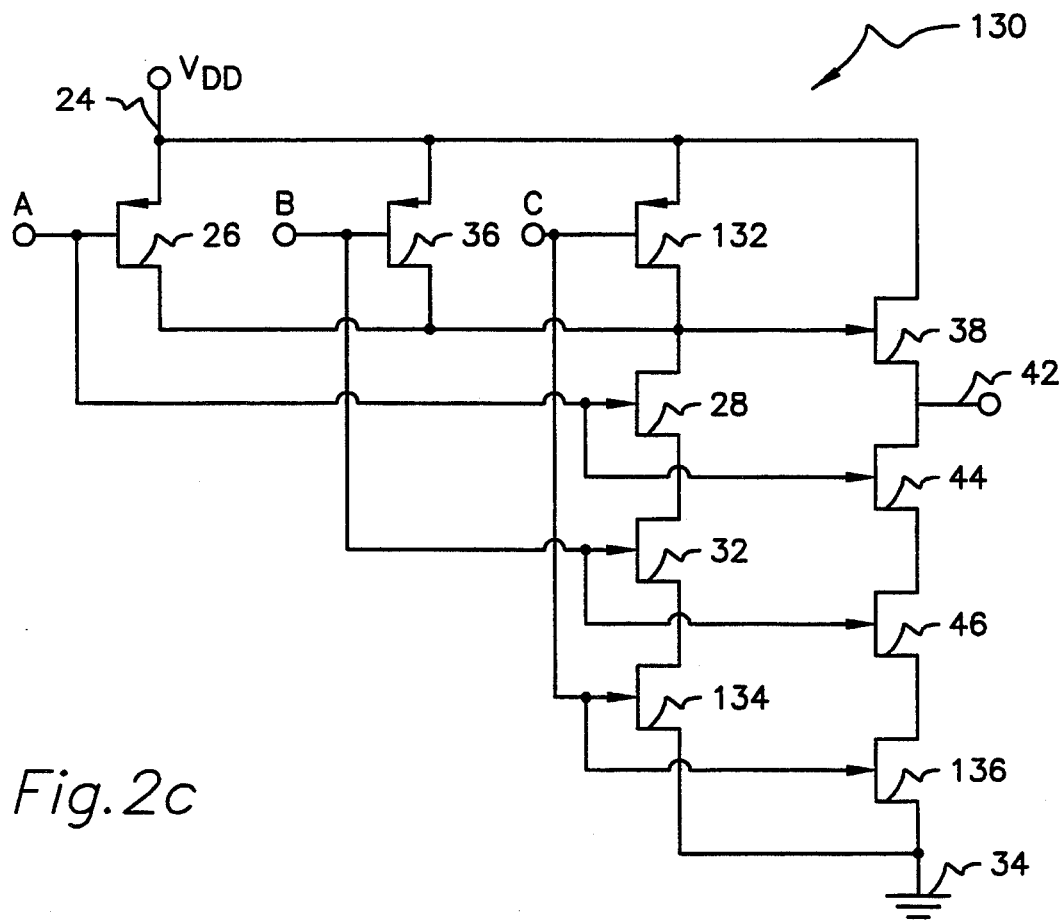
FIG. 2c is a schematic of a three-input NAND gate.

A three-input NAND circuit 130 is revealed in FIG. 2c. The third or C input is a replication of the A or B gate stage. P-channel transistor 132 corresponds to transistors 26 and 36, N-channel transistor 134 corresponds to transistors 28 and 32, and N-channel transistor 136 corresponds to transistors 44 and 46 of circuit 20 of FIG. 2a. Output transistor 38 is common to all the stages.

Figure 2D:
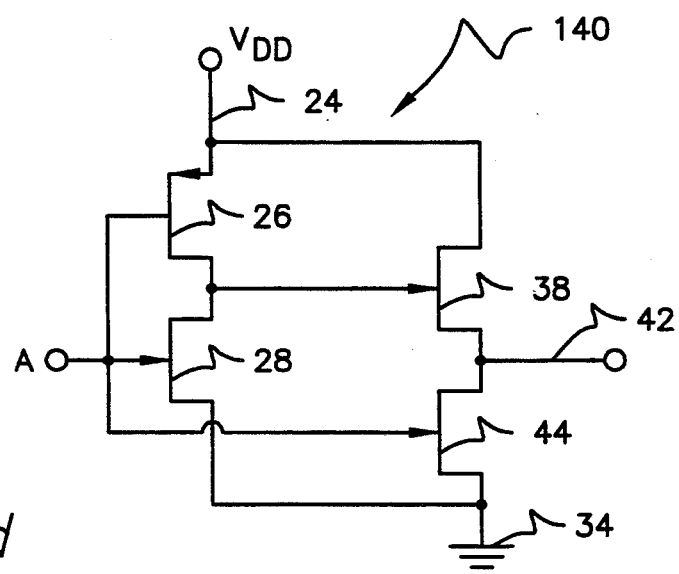
FIG. 2d is a schematic of a basic unit gate.

FIG. 2d reveals the basic unit gate 140.

Figure 2E:
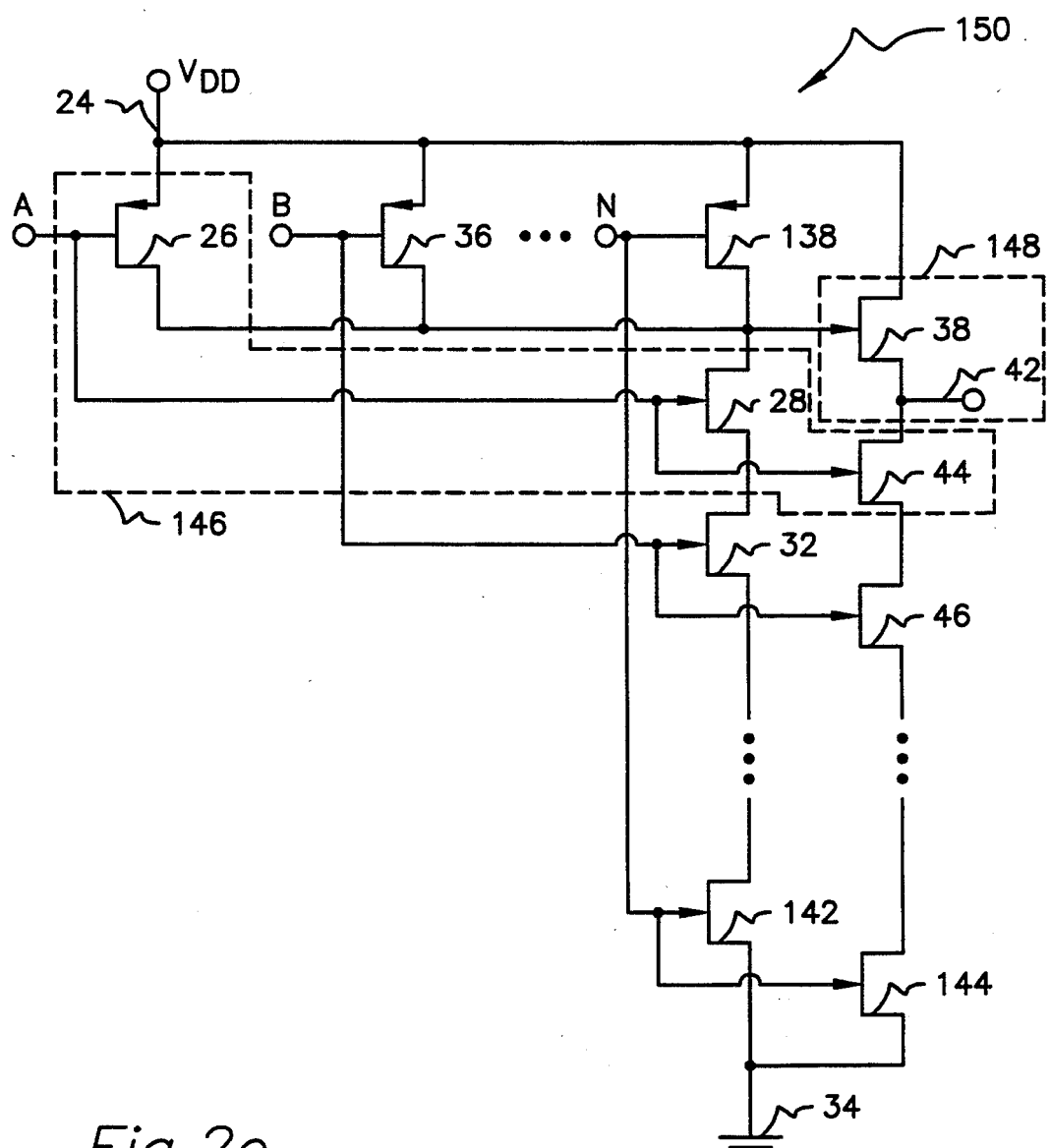
FIG. 2e is schematic of an N-input NAND gate.

FIG. 2e is a diagram of an N-input NAND gate 150. The Nth stage is similar to stages A and B. P-channel transistor 138 corresponds to transistors 26 and 36, N-channel transistor 142 corresponds to transistors 28 and 32, and N-channel transistor 144 corresponds to transistors 44 and 46 of circuit 20 in FIG. 2a. Circuit 146 is a basic unit gate which is replicated according to the number of inputs needed. Circuit 148, incorporating output N-channel transistor 38 and output 42, is common to all of the input stages.

Figure 3A:
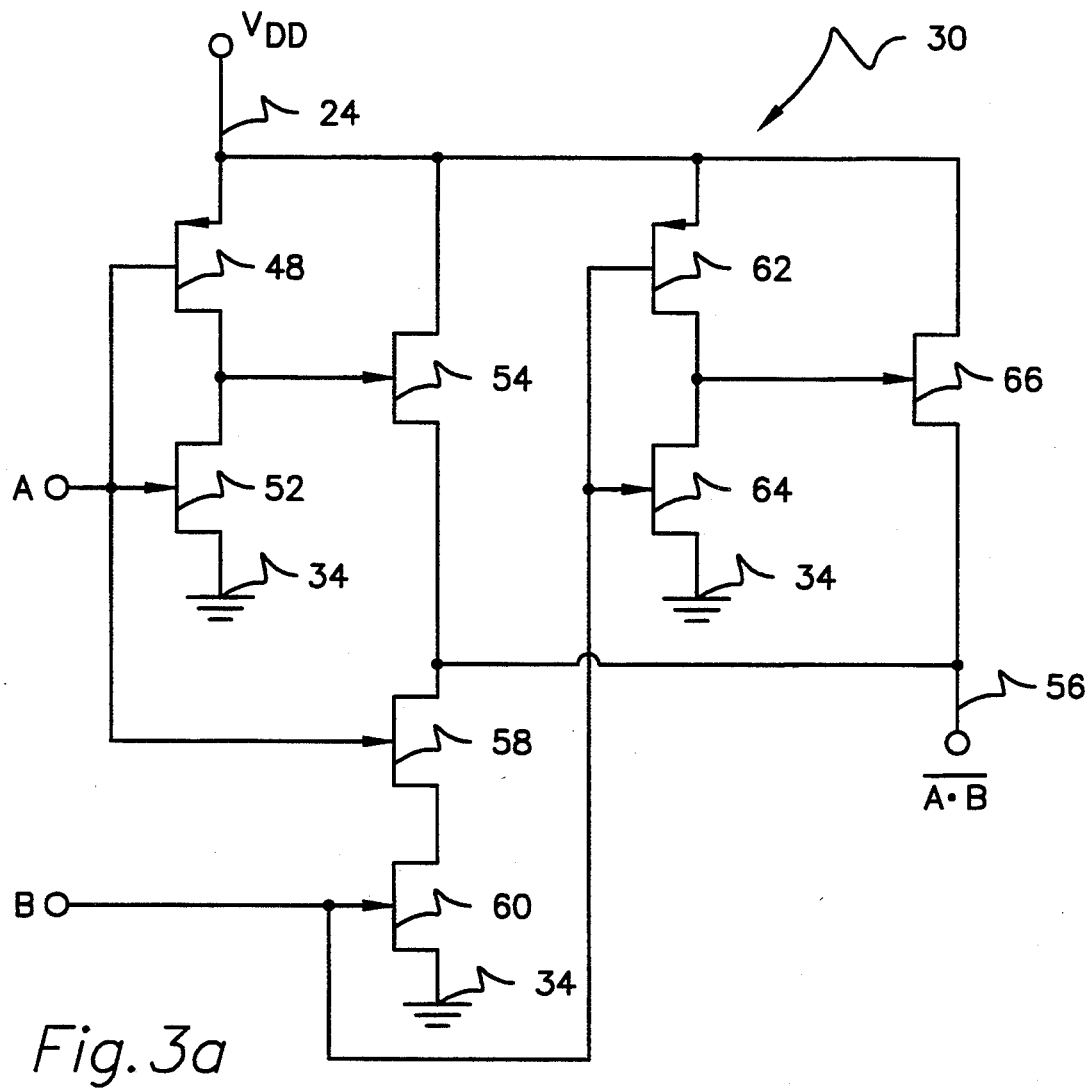
FIG. 3a shows another two-input NAND gate.

FIG. 3a shows circuit 30 as a configuration of the present invention in the form of another NAND type gate. This NAND gate 30 is faster than the NAND gate 20 of FIG. 2a because NAND gate 30 of FIG. 3a does not have N-channel transistors in series in the first stage like transistors 28 and 32 in FIG. 2a. The circuit of FIG. 3 has the same truth table 22 of FIG. 2b. P-channel field effect transistor 48 has a source connected to line 24 which in turn is connected to a positive voltage $V_{DD}$ having a value of approximately 1.5 volts. The gate of transistor 48 is connected to input A and the drain of that transistor is connected to the drain of N-channel field effect transistor 52. The gate of transistor 52 is connected to input A and the source of that transistor is connected to ground or reference terminal 34. N-channel field effect transistor 54 has a drain connected to line 24 and its gate connected to the drains of transistors 48 and 52. The source of transistor 54 is connected to the drain of N-channel field effect transistor 58 and to output 56. The gate of transistor 58 is connected to input A and the source is connected to a drain of N-channel field effect transistor 60. The source of transistor 60 is connected to the ground or reference terminal 34. The gate of transistor 60 is connected to input B. The source of P-channel field effect transistor 62 is connected to line 24. The gate of transistor 62 is connected to input B and its drain is connected to the drain of N-channel field effect transistor 64. The gate of transistor 64 is connected to input B and its source is connected to the ground or reference terminal 34. The drain of N-channel field effect transistor 66 is connected to line 24 and its gate is connected to the drains of transistors 62 and 64. The source of transistor 66 is connected to output line 56.

The function $\overline{A.B}$ at output line 56 of circuit 30 may be illustrated with several examples of inputs from truth table 22 in FIG. 2b. For instance, assume a logic zero signal at input A and a logic one signal at input B. The low signal at the gate of transistor 48 turns that transistor on and the low signal at transistor 52 turns off that transistor; thereby, the signal on the gate of transistor 54 is high thereby turning on transistor 54 and outputting a high signal to line 56 as the gate of transistor 58 sees a low signal thereby turning off that transistor. The logic one signal at input B turns on transistor 60 which is of no consequence to the output, and turns off transistor 62 and turns on transistor 64 thereby pulling the signal at the gate of transistor 66 down thereby switching off transistor 66. The output at line 56 thus is still a logic one signal.

Next, one may assume a logic one signal at both inputs A and B. As noted above, transistor 52 is turned on and transistor 48 is turned off and thus the drain of transistor 52 is pulled down, thereby providing a low signal on transistor 54, and turning off transistor 54. The logic one signal at the gate of transistor 58 turns it on. The logic one signal at input B turns on transistor 60, thereby the drains of transistors 60 and 58 are pulled down to a low voltage value, thereby resulting in a low signal on output 56. Also the high signal at input B turns off transistor 62 and turns on transistor 64 thereby resulting in a low signal to the gate of transistor 66, thereby turning that transistor off and thus allowing the output at line 56 to be low. The results of this and the prior paragraph conform with truth table 22.

Figure 3C:
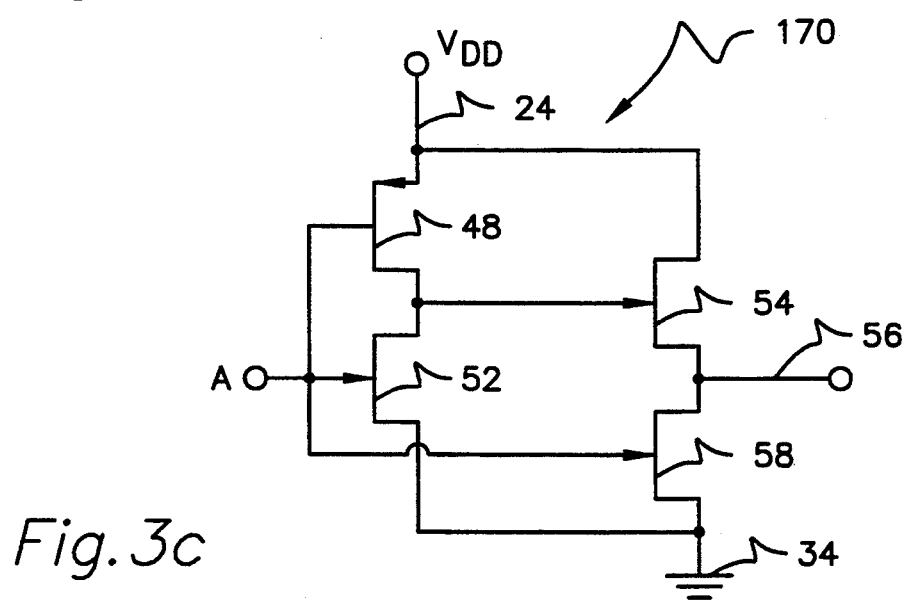
FIG. 3c shows another basic unit gate.
Figure 3B:
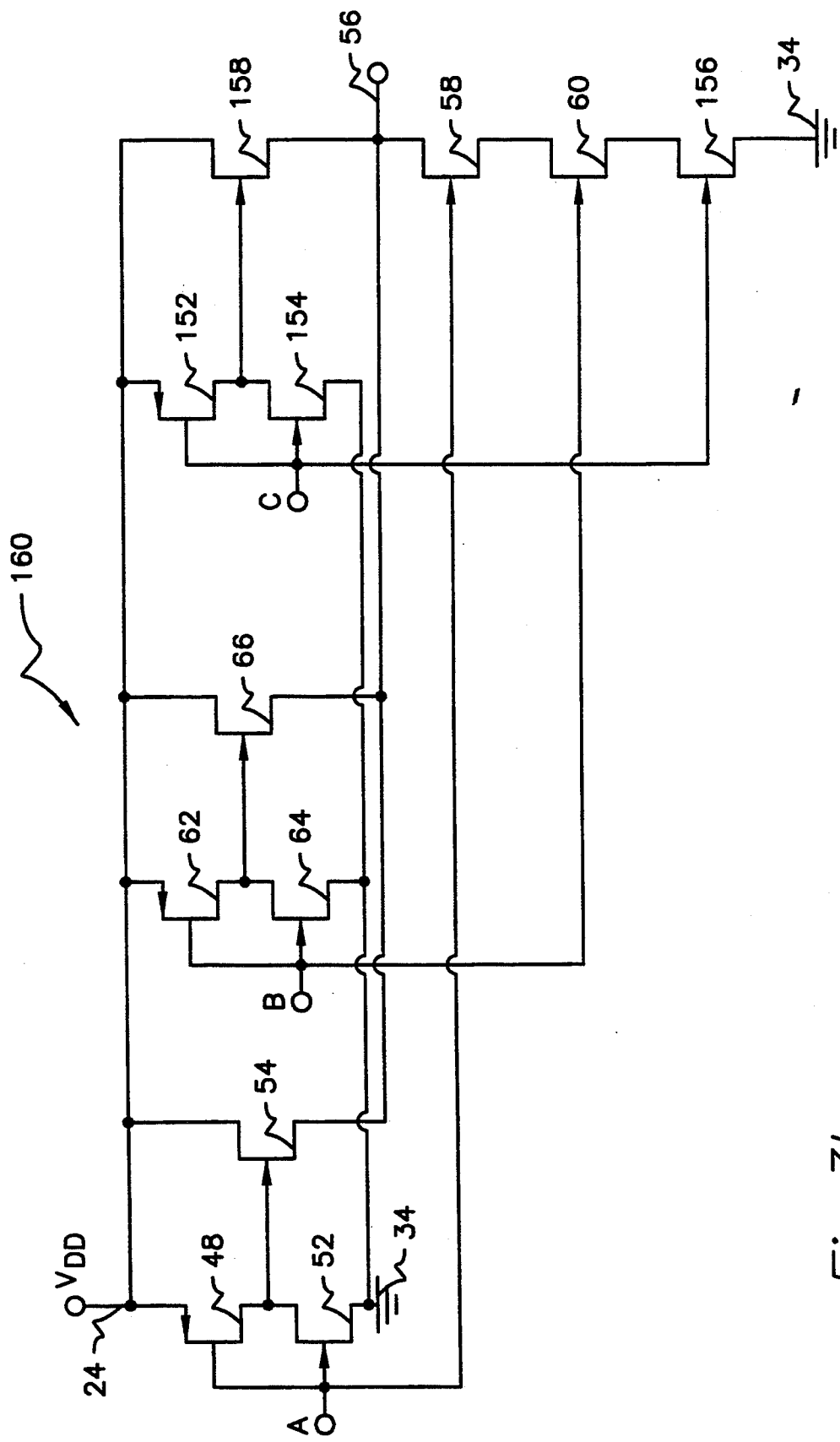
FIG. 3b reveals another three-input NAND gate.

FIG. 3b reveals a three-input NAND circuit 160 embodying the invention as implemented in circuit 30 of FIG. 3a. The third or C stage is like the A or B stage. P-channel transistor 152 corresponds to transistors 48 and 62, N-channel transistor 154 corresponds to transistors 52 and 64, N-channel transistor 156 corresponds to transistors 58 and 60, and N-channel transistor 158 corresponds to transistors 54 and 66 of circuit 30 of FIG. 3a.

FIG. 3c shows another basic unit gate 170.

Figure 3D:
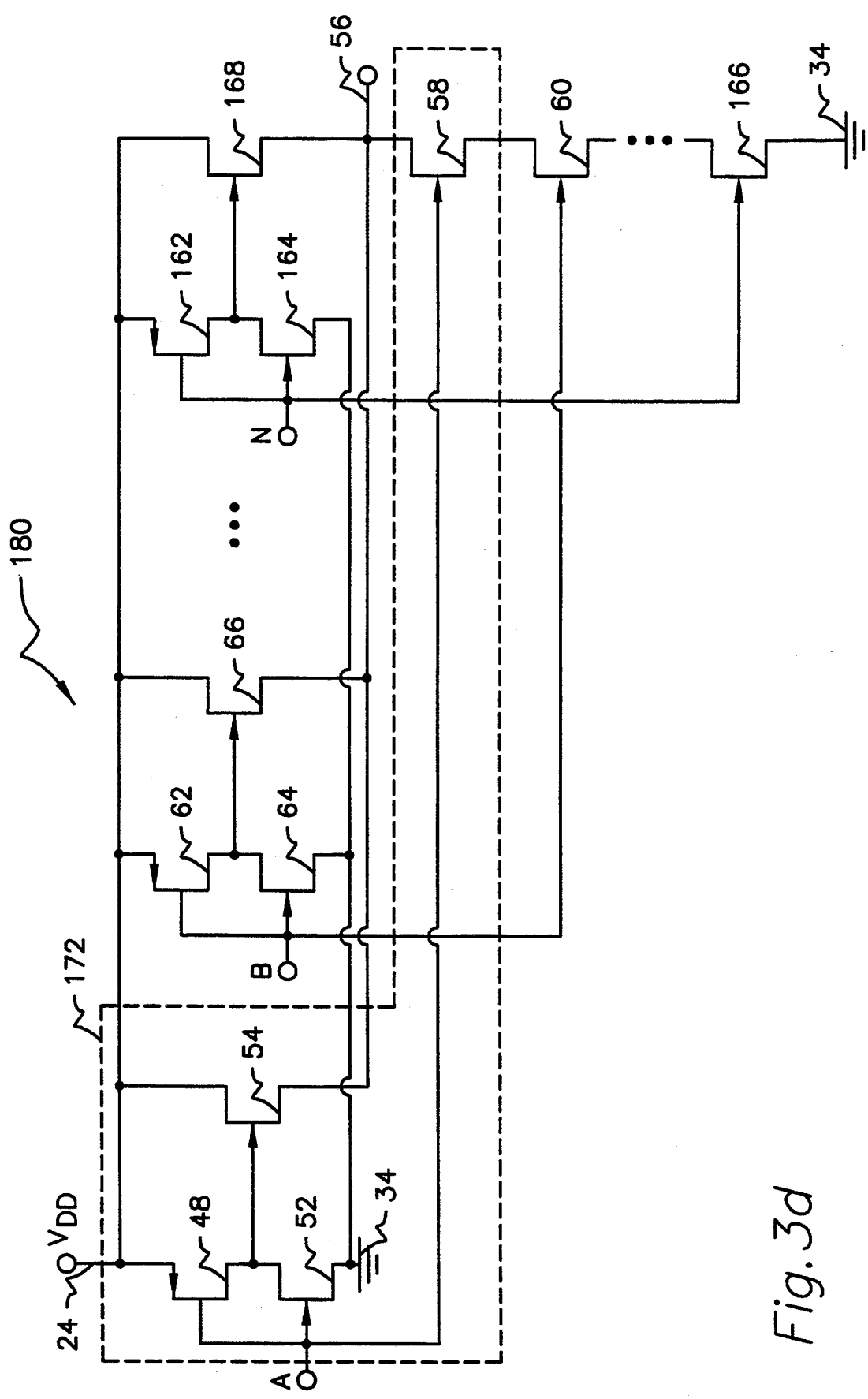
FIG. 3d reveals another N-input NAND gate.

FIG. 3d is a diagram of the N-input NAND gate 180. The Nth stage is similar to the A or B gate stage. P-channel transistor 162 corresponds to transistors 48 and 62, N-channel transistor 164 corresponds to transistors 52 and 64, N-channel transistor 166 corresponds to transistors 58 and 60, and N-channel transistor 168 corresponds to transistors 54 and 66 of circuit 30 in FIG. 3a. Circuit 172 is the basic unit gate like circuit 170 of FIG. 3c.

Figure 4A:
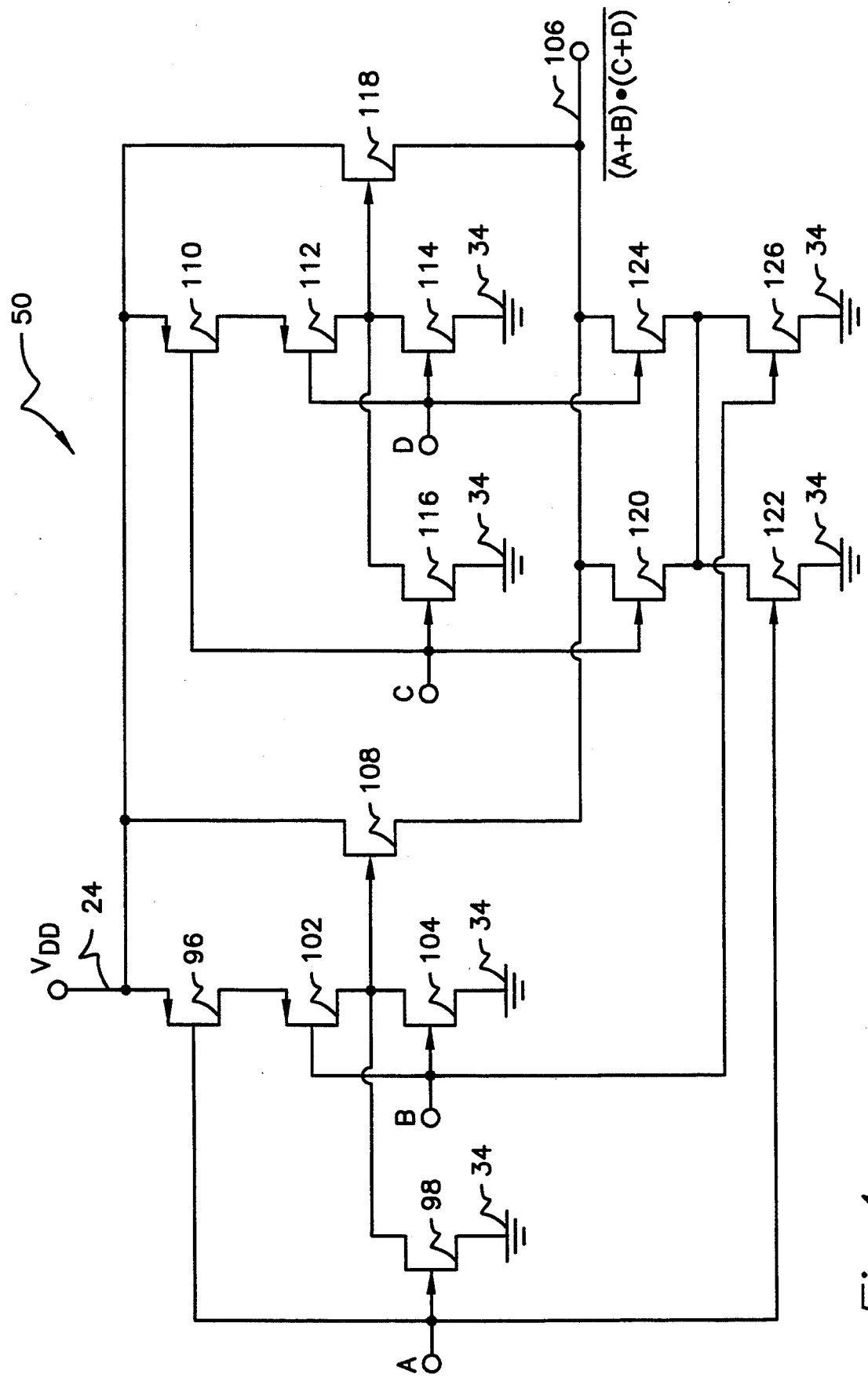
FIGS. 4a and 4b are a complex logic circuit and corresponding truth table incorporating the gate technology of the present invention.
Figure 4B:

FIG. 4a is an application of the invention in circuit 50 which implements a complex logic function $\overline{(A+B).(C+D)}$. There are four inputs A, B, C and D, and an output 106. Table 100 of FIG. 4b shows the logic signal for each combination of logic signals to inputs A, B, C and D. P-channel field effect transistor 96 has a source connected to line 24. Line 24 is connected to a voltage source $V_{DD}$ which is at about 1.5 volts. The gate of transistor 96 is connected to input A and the drain of that transistor is connected to the source of P-channel field effect transistor 102. The gate of transistor 102 is connected to input B and its drain is connected to the drain of N-channel field effect transistor 104. The gate of transistor 104 is connected to input B and its source is connected to ground or reference terminal 34. The drain of N-channel field effect transistor 98 is connected to the drains of transistors 102 and 104. The gate of transistor 98 is connected to input A and its source is connected to reference terminal or ground 34. The drain of N-channel field effect transistor 108 is connected to voltage line 24 and its source is connected to logic output line 106. The gate of transistor 108 is connected to the drains of transistors 98, 102 and 104. The source of P-channel field effect transistor 110 is connected to voltage line 24 and its gate is connected to input C. The drain of transistor 110 is connected to the source of P-channel field effect transistor 112. The gate of transistor 112 is connected to input D and its drain is connected to the drain of N-channel field effect transistor 114. The gate of transistor 114 is connected to input D and its source is connected to ground or reference terminal 34. N-channel field effect transistor 116 has a drain connected to the drains of transistors 112 and 114. The gate of transistor 116 is connected to input C and its source is connected to reference terminal or ground 34. The drain of N-channel field effect transistor 118 is connected to voltage line 24 and its source is connected to logic output line 106 of logic circuit 50. The gate of transistor 118 is connected to the drains of transistors 112, 114 and 116. N-channel field effect transistor 120 has a gate connected to the C input, a drain connected to output line 106 and a source connected to the drain of N-channel field effect transistor 122. Transistor 122 has a gate connected to the A input and a source connected to ground or reference terminal 34. N-channel field effect transistor 124 has a drain connected to output line 106, a gate connected to input D and a source connected to the source of transistor 120 and to the drain of transistor 122. The gate of N-channel field effect transistor 126 is connected to input B, and its drain is connected to the sources of transistors 120 and 124, and to the drain of transistor 122. The source of transistor 126 is connected to reference terminal or ground 34.

Several instances of various logic signals to inputs A, B, C and D can be analyzed to determine what the output signal at line 106 is. In the first instance, A and B have logic zero signals and inputs C and D have logic one input signals. Transistor 96 has a low signal on its gate thereby turning on that transistor. Transistor 102 has a low signal on its gate which is likewise turned on. However, transistor 104 is turned off as a result of a low signal on its gate. Transistor 98 has a low signal on its gate and therefore is turned off. Thus, the gate to transistor 108 is at a high level, thereby turning on transistor 108 and resulting in a high logic one signal on output line 106. The other inputs are examined to see that no other element in the circuit is resistant or opposing the high logic value one on line 106. Transistor 110 has a high value at its gate thereby resulting in the transistor being turned off. Transistor 112 likewise has a high value on its gate thereby being turned off. Transistor 116 has a high value on its gate which turns the transistor on thereby pulling its drain to a low signal and similarly is the case with a parallelly connected transistor 114 which has a high on its gate likewise having its drain pulled to a low level. This results in a low signal at the gate of transistor 118 and in transistor 118 being turned off and of no consequence to output 106. Transistor 120 has a high signal on its gate thereby resulting in it being on and transistor 124 also has a high level signal at its gate resulting in its being turned on. Transistors 122 and 126 have low logic signals at their gates thereby resulting in the transistors being turned off. Thus, the on condition of transistors 120 and 124 is of no consequence as they are in series with transistors 122 and 126 which are not on. Therefore, the high signal on line 106 is not affected.

A second instance of the functionality of circuit 50 may be analyzed with high logic one signals to inputs A, B and D and a low logic input signal to C. Transistor 96 has a high signal on its gate resulting in its being in an off condition. Transistor 102 likewise has a high signal at its gate resulting similarly in an off condition. Transistors 98 and 104 have high level signals at their gates thereby resulting their being in an on condition and pulling the gate voltage level at transistor 108 to a low thereby resulting in transistor 108 being in an off condition. Transistor 110 has a low signal at its gate thereby resulting in an on condition, but transistor 112 has a high signal at its gate thereby resulting in its being in an off condition. Transistor 116 has a low input signal resulting in its being in an off condition, but transistor 114 has a high signal at its gate resulting in its being in an on condition thereby pulling the signal level at the gate of transistor 118 to a low thereby turning off transistor 118. Transistor 120 has a zero or low logic value on its gate thereby resulting in an off condition. Transistor 122 has a high signal at its gate thereby resulting in an on condition which pulls its drain to a low level. Transistor 126 likewise has a high signal on its gate resulting in its on condition pulling its drain to a low level. Transistor 124 has a high logic signal at its gate resulting in its being in an on condition and thereby, in conjunction with transistors 122 and/or 126, pulls logic output line 106 to a low logic zero signal level. Similar analyses using various logic levels to inputs A, B, C and D show a particular value at output 106 for a given combination, as shown in truth table 100 of FIG. 4b.

Figure 5B:
FIGS. 5a and 5b are the schematic and truth table, respectively, of another complex logic function circuit incorporating the basic gate of the present invention.
Figure 5A:
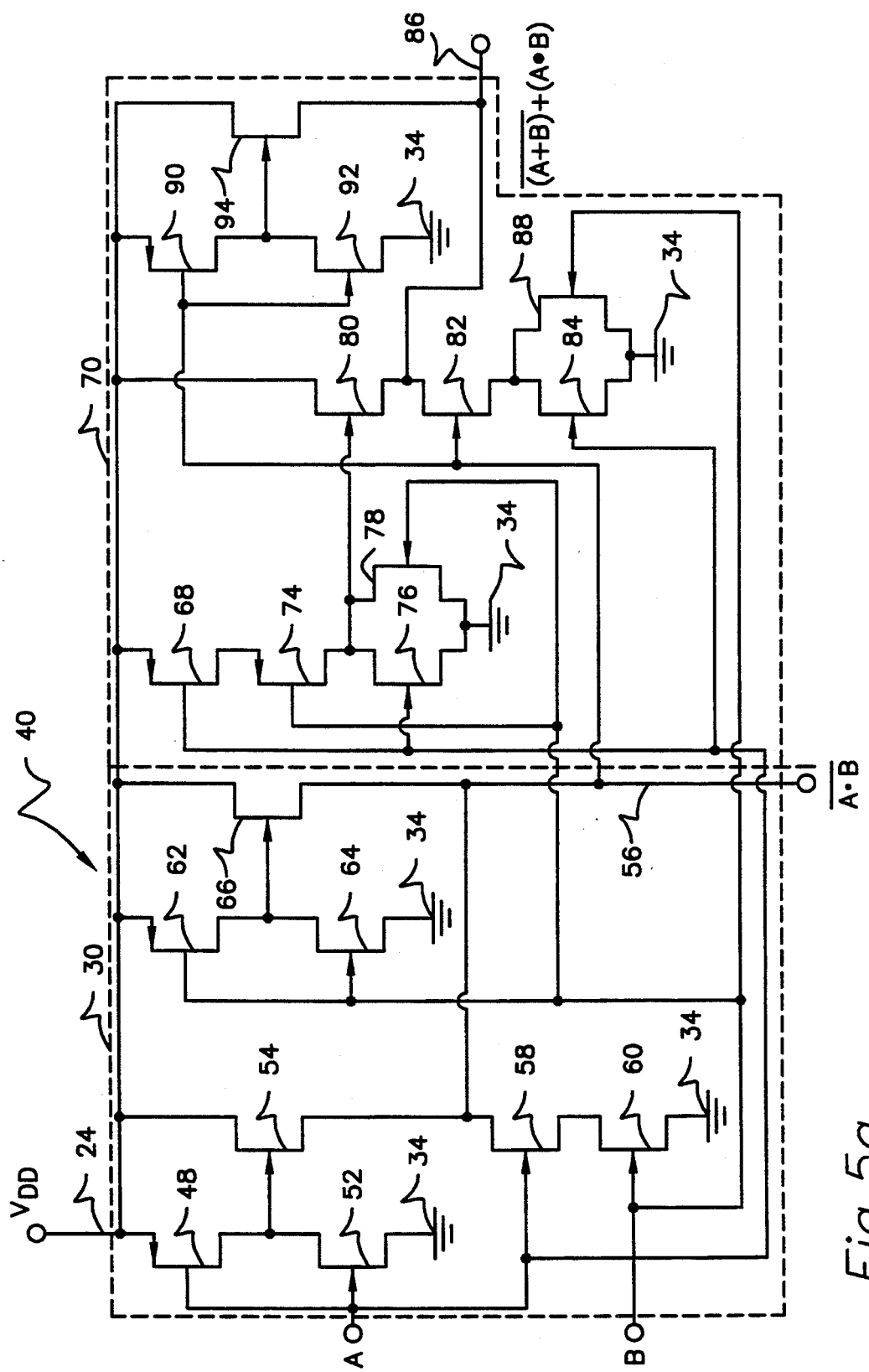
Figure 6:
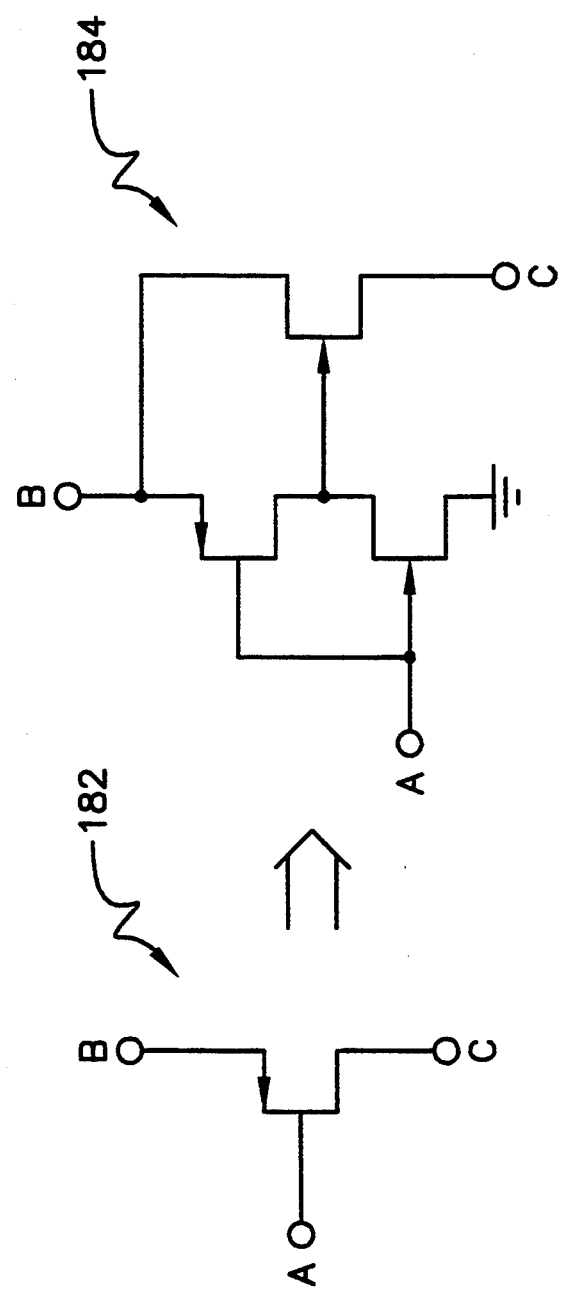
FIG. 6 shows a basic input circuit.

FIG. 5a is a schematic of an exclusive-NOR logic circuit 40. The exclusive NOR function may be represented as $\overline{(A+B)} + (A.B)$. The first portion of circuit 40 is circuit 30 as illustrated in FIG. 3a. Circuit 30 was described above. The remaining portion 70 of circuit 40 is described in this paragraph. A truth table 72 in FIG. 5b is applicable to circuit 40 of FIG. 5a. P-channel field effect transistor 68 has a source connected to line 24 and a gate connected to input A. A drain of transistor 68 is connected to the source of P-channel field effect transistor 74. The gate of transistor 74 is connected to input B. The drain of transistor 74 is connected to the drains of N-channel field effect transistors 76 and 78. The gate of transistor 76 is connected to input A and the gate of transistor 78 is connected to input B. The sources of transistors 76 and 78 are connected to ground or reference terminal 34. The gate of N-channel field effect transistor 80 is connected to the drains of transistors 74, 76 and 78. The drain of transistor 80 is connected to line 24 and its source is connected to output line 86. The drain of N-channel field effect transistor 82 is connected to the source of transistor 80. The gate of transistor 82 is connected to line 56 which is the output of circuit 30. The source of transistor 82 is connected to the drains of N-channel field effect transistors 84 and 88. The sources of transistors 84 and 88 are connected to reference terminal or ground 34. The gate of transistor 84 is connected to input A and the gate of transistor 88 is connected to input B. The source of P-channel field effect transistor 90 is connected to line 24 and its gate is connected to output line 56 of circuit 30. The drain of transistor 90 is connected to the drain of N-channel field effect transistor 92. The gate of transistor 92 is connected to line 56 of circuit 30. The source of transistor 92 is connected to reference terminal or ground 34. N-channel field effect transistor 94 has a drain connected to line 24 and a source connected to output line 86 of circuit 40. The gate of transistor 94 is connected to the drains of transistors 90 and 92.

Functionally, circuit 40 may be examined first under the conditions of a logic input signal zero at A and a logic signal one at input B. With these conditions, output line 56 is at a logic one signal according to truth table 22 of FIG. 2b. The low signal at input A turns on transistor 68, and the high signal at input B turns off transistor 74. The low signal at input A turns off transistor 76, and the high signal at input B turns on transistor 78 which in turn presents a low signal at the gate of transistor 80. Thus, transistor 80 is turned off. The high signal at line 56 turns on transistor 82 and the high signal from input B turns on transistor 88 thereby pulling line 86 to a logic zero. The logic zero input from input A to the gate of transistor 84 turns off that transistor and is of no consequence. The high logic one signal at line 56 goes to the gates of transistors 90 and 92 thereby turning off transistor 90 and turning on transistor 92 which in turn presents a logic zero signal at the gate of transistor 94 thereby shutting off transistor 94 and thus allowing output line 86 to remain at a logic zero.

The next examined instance is when both inputs A and B have logic high signals. When inputs A and B are high output line 56 of circuit 30 is at a logic zero. The high signal of input A goes to the gate of transistor 68 thereby turning off transistor 68. The high signal of input B goes to transistor 74 thereby turning off transistor 74. The gates of transistors 76 and 78 receive high signals from inputs A and B, respectively, thereby turning on both transistors 76 and 78, and consequently pulling the gate of transistor 80 to a logic zero low signal thereby turning transistor 80 off. Transistor 82 has a low signal applied to it from output line 56 thereby turning off transistor 82. Transistors 84 and 88 have high logic signals from inputs A and B to their gates, respectively, thereby turning on transistors 84 and 88 which have no consequence on output 86 since transistor 82 is off. Transistors 90 and 92 have a low signal from line 56 at their gates, which results in their turning on transistor 90 and the turning off transistor 92. Thus, the gate of transistor 94 has a high signal applied to it thereby turning on transistor 94 and pulling output line 86 up to a logic one signal. All the other combinations of inputs to A and B may be similarly analyzed to determine the output at line 86. The results are in table 72 of FIG. 5b.

Figure 7:
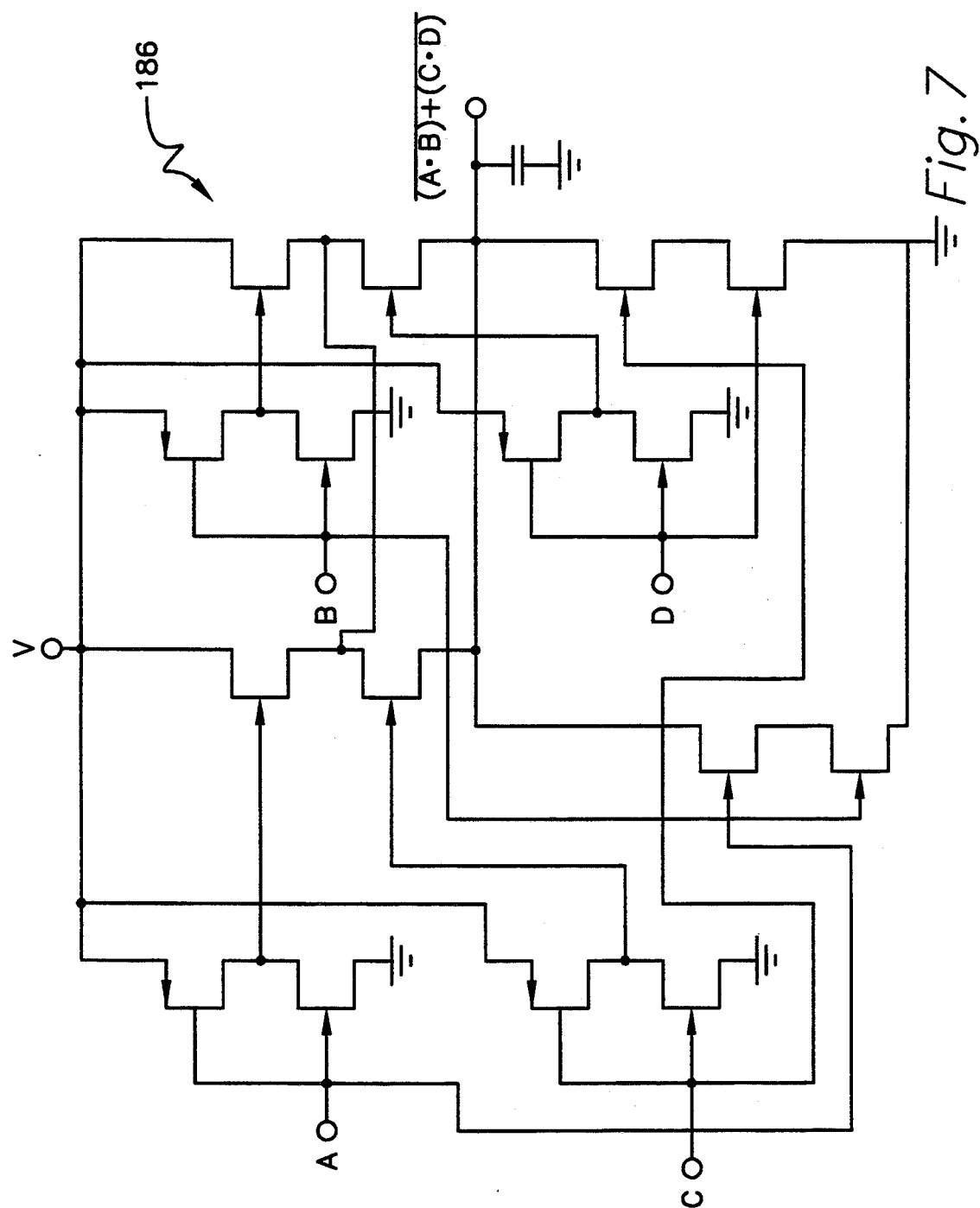
FIGS. 7, 8 and 9 reveal circuits incorporating the invention.
Figure 8:
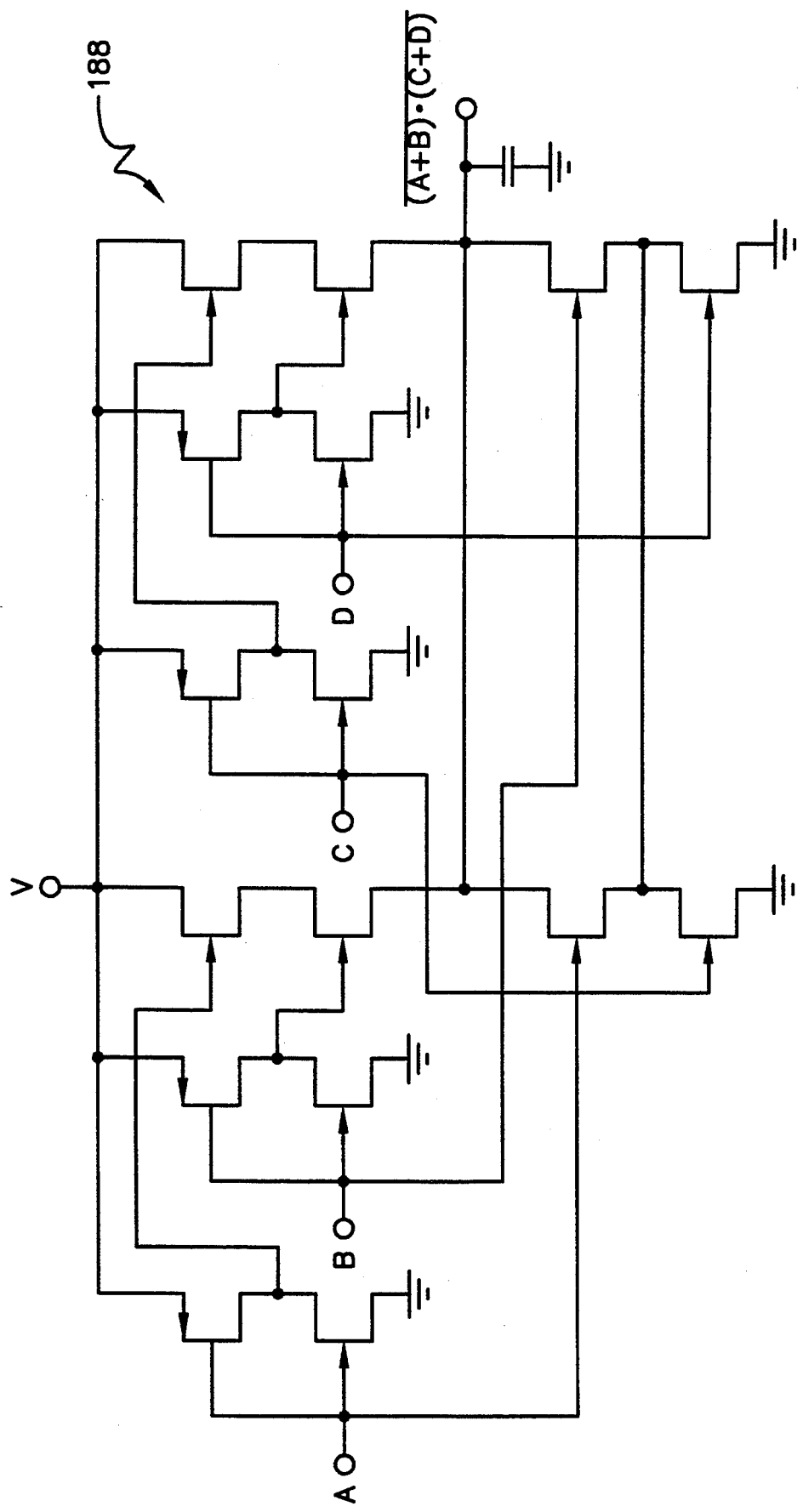

The principle of the invention is the replacement of P-channel transistors of CMOS logic circuits with a three-transistor circuit for obtaining logic circuits with improved performance. A logic input 182 is of an ordinary CMOS logic circuit. The present invention replaces circuit 182 with circuit 184 which provides for greater speed to the respective logic circuit. FIGS. 7 and 8 are examples of standard logic circuits having circuit configuration 184 replacing transistor 182. Circuit 186 of FIG. 7 has the logic function not ((A.B)+(C.D)). Circuit 188 of FIG. 8 has the function not ((A+B).(C+D)).

Figure 9:
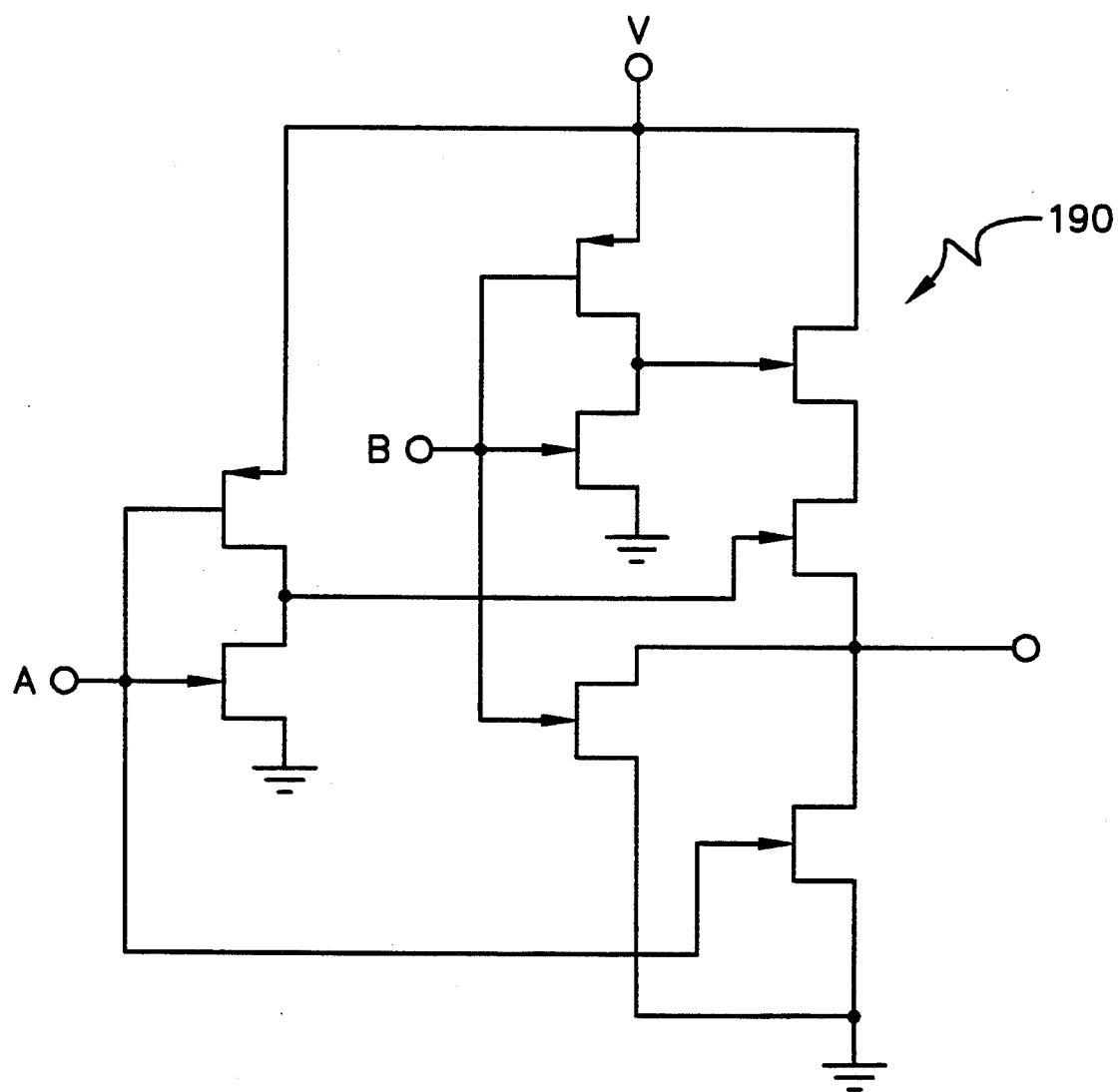

For processes in which the N-channel transistor or FET is significantly faster than the P-channel transistor (e.g., in GaAs-based materials). The circuits incorporating N-channel configuration 184 are faster and can drive larger capacitive loads than circuits incorporating P-channel configuration 182. The high speed is obtained because the P-channel FET of configuration 184 do not drive the output capacitance. Simple gates, such as NAND and NOR gates, are subsets of circuits 186 and 188, respectively, of FIGS. 7 and 8. Circuit 190 of FIG. 9 is a two-input NOR gate incorporating the invention.

Substitution of the above-noted transistors with other devices having similar functions, respectively, may be made. For integrated circuit implementation of the invention, materials from groups IV or III and V (such as gallium arsenide) may be used.

The above-noted logic gates can be extended to gates having a number of inputs different from those presented. For example, two-input NAND gates were described, but NAND gates having one, three, or more inputs are variations or extensions of the circuits described herein. These variations and extensions are of the present invention.

I claim:

1. A buffered complementary logic gate comprising:
   a first input terminal;
   a second input terminal;
   a first output terminal;
   a first N-channel field effect transistor having a gate connected to the first input terminal, having a source connected to a reference terminal, and having a drain;
   a first P-channel field effect transistor having a gate connected to the first input terminal, a source connected to a voltage terminal, and a drain connected to the drain of said first N-channel field effect transistor;
   a second N-channel field effect transistor having a gate connected to the drain of said first N-channel field effect transistor, having a drain connected to the voltage terminal, and having a source connected to the first output terminal;
   a third N-channel field effect transistor having a gate connected to the gate of said first N-channel field effect transistor, having a drain connected to the source of said second N-channel field effect transistor, and having a source;
   a fourth N-channel field effect transistor having a gate connected to the second input terminal, having drain connected to the source of said third N-channel field effect transistor, and having a source connected to the reference terminal;
   a second P-channel field effect transistor having a gate connected to the second input, having a source connected to the voltage terminal, and having a drain;
   a fifth N-channel field effect transistor having a gate connected to the second input terminal, having a drain connected to the drain of said second P-channel field effect transistor, and having a source connected to the reference terminal; and
   a sixth N-channel field effect transistor having a gate connected to the drain of said fifth N-channel transistor, having a drain connected to the voltage terminal, and having a source connected to the first output terminal.

2. A buffered complementary logic gate comprising:
   a first input terminal;
   a second input terminal;
   a third input terminal;
   a fourth input terminal;
   an output terminal;
   a first N-channel field effect transistor having a gate connected to the first input terminal, having a source connected to a reference terminal, and having a drain;
   a second N-channel field effect transistor having a gate connected to the second input terminal, having a source connected to the reference terminal, and having a drain connected to the drain of said first N-channel field effect transistor;
   a third N-channel field effect transistor having a gate connected to the drain of said second N-channel field effect transistor, having a drain connected to a voltage terminal, and having a source connected to the output terminal;
   a first P-channel field effect transistor having a gate connected to the first input, having an source connected to the voltage terminal, and having a drain;
   a second P-channel field effect transistor having a gate connected to the second input terminal, having a source connected to the drain of said first P-channel field effect transistor, and having a drain connected to the gate of said third N-channel field effect transistor;
   a fourth N-channel field effect transistor having a gate connected to the third input, having a source connected to the reference terminal, and having a drain;
   a fifth N-channel field effect transistor having a gate connected to the fourth input, having a drain connected to the drain of said fourth N-channel field effect transistor, and having a source connected to the reference terminal, a sixth N-channel field effect transistor having a gate connected to the drain of said fifth N-channel field effect transistor, having a drain connected to the voltage terminal, and having a source connected to the output terminal;

a third P-channel field effect transistor having a gate connected to the third input terminal, having a source connected to the voltage terminal, and having a drain;

a fourth P-channel field effect transistor having a gate connected to the fourth input terminal, having a source connected to the drain of said third P-channel transistor, and having a drain connected to the drain of said fifth N-channel field effect transistor;

a seventh N-channel field effect transistor having a gate connected to the first input terminal, having a source connected to the reference terminal, and having a drain;

an eighth N-channel field effect transistor having a gate connected to the second input terminal, having a drain connected to the drain of said seventh N-channel field effect transistor, and having a source connected to the reference terminal;

a ninth N-channel field effect transistor having a gate connected to the third input terminal, having a drain connected to the output terminal, and having a source connected to the drain of said seventh N-channel field effect transistor; and a tenth N-channel field effect transistor having a gate connected to the fourth input terminal, having a drain connected to the output terminal, and having a source connected to the drain of the eight N-channel field effect transistor.

3. A logic circuit (188) comprising:

a first input terminal;

a first N-channel transistor having a first terminal connected to the first input, the second terminal connected to a reference terminal, and a third terminal;

a first P-channel transistor having a first terminal connected to the first input terminal, a second terminal connected to the third terminal of the first N-channel transistor, and having a third terminal connected to a voltage terminal;

a second input terminal;

a second N-channel transistor having the first terminal connected to the second input terminal, a second terminal connected to the reference terminal, and a third terminal;

a second P-channel transistor having a first terminal connected to the second input terminal, a second terminal connected to the third terminal of the second N-channel transistor, and a third terminal connected to a voltage terminal;

a third N-channel transistor having a first terminal connected to the second terminal of the first P-channel transistor, a second terminal, and a third terminal connected to the voltage terminal;

an output terminal;

a fourth N-channel transistor having a first terminal connected to the second terminal of the second P-channel transistor, a second terminal connected to the output terminal, and a third terminal connected to the second terminal of the third N-channel transistor;

a third input terminal;

a fifth N-channel transistor having a first terminal connected to the third input terminal, having a second terminal connected to the reference terminal, and having a third terminal;

a third P-channel transistor having a first terminal connected to the third input terminal, a second terminal connected to the third terminal of the fifth N-channel transistor, and a third terminal connected to the voltage terminal;

a fourth input terminal;

a sixth N-channel transistor having a first terminal connected to the fourth input terminal, second terminal connected to the reference terminal, and a third terminal;

a fourth P-channel transistor having a first terminal connected to the fourth input terminal, a second terminal connected to the third terminal of the sixth N-channel transistor and having a third terminal connected to the voltage terminal;

a seventh N-channel transistor having a first terminal connected to the second terminal of the third P-channel transistor, a second terminal, and a third terminal connected to the voltage terminal;

an eighth N-channel transistor having a first terminal connected to the second terminal of the fourth P-channel transistor, the second terminal connected to the output terminal, and a third terminal connected to the second terminal of the seventh N-channel transistor;

a ninth N-channel transistor having a first terminal connected to the first input terminal, the second terminal, and a third terminal connected to the output terminal;

a tenth N-channel transistor having a first terminal connected to the third input terminal, a second terminal connected to the reference terminal, and a third terminal connected to the second terminal of the ninth N-channel transistor;

an eleventh N-channel transistor having a first terminal connected to the second input terminal, a second terminal connected to the third terminal of the tenth N-channel transistor, and a third terminal connected to the output terminal; and a twelfth N-channel transistor having a first terminal connected to the fourth input terminal, a second terminal connected to the reference terminal, and a third terminal connected to the second terminal of the eleventh N-channel transistor.

4. A logic circuit (186) comprising:

a first input terminal;

a second input terminal;

a third input terminal;

a fourth input terminal;

an output terminal;

a reference terminal;

a voltage terminal;

a first N-channel transistor having a first terminal connected to the first input terminal, a second terminal connected to the reference terminal, and a third terminal;

a first P-channel transistor having a first terminal connected to the first input terminal having a second terminal connected to the third terminal of the first N-channel transistor, and a third terminal connected to the voltage terminal;

a second N-channel transistor having a first terminal connected to the second terminal of the first P-channel transistor, a second terminal, and a third terminal connected to the voltage terminal;

a third N-channel transistor having a first terminal, a second terminal connected to the output terminal, having a third terminal connected to the second terminal of the second N-channel transistor;

a fourth N-channel transistor having a first terminal connected to the second input terminal, a second terminal connected to the reference terminal, and a third terminal;

a second P-channel transistor having a first terminal connected to the second input terminal, a second terminal connected to the third terminal of the fourth N-channel transistor, and a third terminal connected to the voltage terminal;

a fifth N-channel transistor having a first terminal connected to the second terminal of the second P-channel transistor, a second terminal connected to the third terminal of said third N-channel transistor, and a third terminal connected to the voltage terminal;

a sixth N-channel transistor having a first terminal connected to the third input terminal, a second terminal connected to the reference terminal, and a third terminal connected to the first terminal of the third N-channel transistor;

a third P-channel transistor having a first terminal connected to the third input terminal, a second terminal connected to the third terminal of the sixth N-channel transistor, and a third terminal connected to the voltage terminal;

a seventh N-channel transistor having a first terminal connected to the fourth terminal, a second terminal connected to the reference terminal, and a third terminal;

a fourth P-channel transistor having a first terminal connected to the fourth input terminal, a second terminal connected to the third terminal of the seventh N-channel transistor, and a third terminal connected to the voltage terminal;

an eighth N-channel transistor having a first terminal connected to the third terminal of the seventh N-channel transistor, a second terminal connected to the output terminal, and a third terminal connected to the second terminal of the fifth N-channel transistor;

a ninth N-channel transistor having a first terminal connected to the first input terminal, the second terminal, and a third terminal connected to the output terminal;

a tenth N-channel transistor having a first terminal connected to the second input terminal, a second terminal connected to the reference terminal, and a third terminal connected to the second terminal of ninth N-channel transistor;

an eleventh N-channel transistor having a first terminal connected to the third input terminal, a second terminal, and a third terminal connected to the output terminal; and a twelfth N-channel transistor having a first terminal connected to the fourth input terminal, a second terminal connected to the reference terminal, and a third terminal connected to the second terminal of the eleventh N-channel transistor.

5. A logic circuit (190) comprising:

a first input terminal;

a second input terminal;

an output terminal;

a first N-channel transistor having a gate connected to the first input terminal, a source connected to a reference terminal, and a drain;

a first P-channel transistor having a gate connected to the gate of the first N-channel transistor, a drain connected to the drain of the first N-channel transistor, and a source connected to a voltage terminal;

a second N-channel transistor having a gate connected to the second input terminal, a source connected to the reference terminal, and a drain;

a second P-channel transistor having a gate connected to the gate of the second N-channel transistor, a drain connected to the drain of the second N-channel transistor, and a source connected to the voltage terminal;

a third N-channel transistor having a gate connected to the drain of the first P-channel transistor, a source connected to the output terminal, and a drain;

a fourth N-channel transistor having a gate connected to the drain of the second P-channel transistor, a source connected to the drain of the third N-channel transistor, and a drain connected to the voltage terminal;

a fifth N-channel transistor having a gate connected to the gate of the first N-channel transistor, a drain connected to the source of the third N-channel transistor, and a source connected to the reference terminal; and a sixth N-channel transistor having a gate connected to the gate of the second N-channel transistor, a drain connected to the source of the third N-channel transistor, and a source connected to the reference terminal.

* * * * *